United States Patent [19]
Aoki et al.

[11] Patent Number: 5,776,788
[45] Date of Patent: Jul. 7, 1998

[54] METHOD FOR FORMING A STRONG DIELECTRIC FILM BY THE SOL-GEL TECHNIQUE AND A METHOD FOR MANUFACTURING A CAPACITOR

[75] Inventors: Katsuhiro Aoki, Tsukuba; Yukio Fukuda, Toukai-mura; Akitoshi Nishimura, Tsuchiura, all of Japan

[73] Assignee: Texas Instruments Incorporated, Dallas, Tex.

[21] Appl. No.: 601,884

[22] Filed: Feb. 15, 1996

Related U.S. Application Data

[63] Continuation of Ser. No. 228,536, Apr. 15, 1994, abandoned.

[30] Foreign Application Priority Data

Apr. 16, 1993 [JP] Japan .................................. 5-113974

[51] Int. Cl.[6] .................................................. H01L 21/70
[52] U.S. Cl. .............................. 437/60; 437/47; 437/52; 437/919
[58] Field of Search ........................ 437/47, 52, 60, 437/919; 29/25.42; 361/313; 257/295; 365/117

[56] References Cited

U.S. PATENT DOCUMENTS

| | | |
|---|---|---|
| 4,963,390 | 10/1990 | Lipeles et al. . |
| 5,122,477 | 6/1992 | Wotters et al. .................... 437/60 |
| 5,188,902 | 2/1993 | Lin .............................. 428/426 |
| 5,191,510 | 3/1993 | Huffman ........................ 361/313 |
| 5,198,269 | 3/1993 | Swartz et al. ................... 427/226 |
| 5,213,591 | 5/1993 | Celikkaya et al. ................ 51/293 |
| 5,216,572 | 6/1993 | Larson et al. ................... 361/313 |
| 5,348,775 | 9/1994 | Lin ............................. 427/555 |
| 5,442,585 | 8/1995 | Eguchi et al. ................... 365/149 |
| 5,453,294 | 9/1995 | Ogi et al. ...................... 427/100 |
| 5,572,052 | 11/1996 | Kashihara et al. ................. 257/295 |

OTHER PUBLICATIONS

Hackh's Chemical Dictionar, p. 261. Julius Grant Cauj McGraw-Hill 1984.

Weast (ed.) CRC Handbook of Chemistry & Physics, CRC Press, 54th ed. ®1973 pp. C-100, C-453.

Miyazawa et al., "Microstructural Characterization of Gel-Derived Thin Films," in Nucleation & Crystallization in Liquids and Glasses, vol. 30, presented Aug. 16-19, 1992, pp. 331-334.

Ferroelectrics, vol. 116, No. 1-2, pp. 1-17, *"Processing and Characterization of Sol-Gel Derived Very Thin Film Ferroelectric Capacitors"*, 1991, L. E. Sanchez, et al.

Patent Abstracts of Japan, vol. 17, No. 46 (C-1021), 28 Jan. 1993, Katsumi, et al.

Journal of Applied Physics, vol. 71, No. 9, 1 May 1992, *"Guided-Wave Optical Properties of Sol-Gel Ferroelectric Films"*, pp. 4557-4566, V. E. Wood, et al.

Patent Abstract of Japan, vol. 14, No. 131 (C-700) (4074), 13 Mar. 1990.

*Primary Examiner*—Tuan H. Nguyen
*Attorney, Agent, or Firm*—Richard L. Donaldson; William B. Kempler

[57] ABSTRACT

A method for forming a PZT strong dielectric film by the sol-gel technique, in which the thickness of the film is substantially no greater than 1000 Å. In another aspect, the drying temperature of the raw material sol-gel solution for forming the PZT dielectric film is maintained within the range of 130°-200° C., and is particularly set lower than the boiling point of the stabilizer contained in the sol-gel raw material and higher than the boiling point of the solvent contained in the sol-gel raw material. As a result of performing the oxidative sintering treatment at a temperature at which perovskite crystals form, it becomes possible to readily form thin films exhibiting a (100) crystal orientation in particular. Additionally, completely crack-free thick films can be formed.

9 Claims, 8 Drawing Sheets

FIG. 1   * THESE ARE DUE TO THE BY-PRODUCT TITANIUM OXIDE AND NOT DIRECTLY RELATED TO THE PZT FILM

GEL FILM DRIED AT 170°C

GEL FILM DRIED AT 250°C

RELATION BETWEEN NUMBER OF APPLICATIONS AND FILM THICKNESS AT DIFFERENT DRYING TEMPERATURES

METHOD FOR FORMING A STRONG DIELECTRIC FILM BY THE SOL-GEL TECHNIQUE AND A METHOD FOR MANUFACTURING A CAPACITOR

This application is a continuation, of application Ser. No. 08/228.536, filed Apr 15, 1994, now abandoned.

The present invention concerns a method for forming a strong dielectric film (in particular, a lead zirconate titanate (PZT) film) by the sol-gel technique and a method for manufacturing a capacitor (in particular, a capacitor for a semiconductor memory cell).

BACKGROUND OF THE INVENTION

Examples of insulating films (dielectric films) that are used in capacitors for dynamic RAM memory include ONO films with a structure obtained by sequentially laminating $SiO_2$, $SI_3N_4$, and $SiO_2$.

However, because ONO films have a dielectric constant of approximately 5, when they are used in large-capacity memories of more than 256 Mb, they entail major process problems that include the necessity to form them into complex configurations in order to expand the area or reduce the thickness of the capacitor's dielectric film due to restrictions with regard to area.

In contrast, strong dielectric film materials with a perovskite crystal structure have extremely high dielectric constants of a few hundred to a few thousand, and therefore have attracted attention as insulating film materials for capacitors for use in dynamic RAM devices in the future.

Of such strong dielectric film materials, the use of a thin film forming method called the sol-gel technique is known in forming PZT films expressed by $Pb(Zr, Ti)O_3$.

In FIG. 18, a method for forming $Pb(Zr, Ti)O_3$ thin films by the sol-gel technique is explained.

First, in process 1, a precursor consisting of the sol-gel raw material solution is prepared by the hydrolysis and condensation polymerization of a metal alkoxide; in process 2, this is then applied to a substrate by, e.g., spin coating or dip coating, after which in process 3 the resulting article is dried at a temperature of 100°–300° C. to form the applied sol-gel thin film into a dry gel (polymer gel). In process 4, an oxidative sintering treatment is carried out in a 600 C. or above high- temperature oxygen atmosphere, then a $Pb(Zr, Ti)O_3$ thin film with a perovskite crystal structure is obtained from the resulting dry gel to conclude the process. When it is desired to increase the thickness of the obtained PZT film, the aforementioned processes 2 and 3 are repeated.

Here, conventionally, solutions obtained by diluting the organometal compounds that constitute structural metal elements $Pb(CH_3COO)_2 \cdot 3H_2O$ (lead acetate), Ti $(i-OC_3H_7)_4$ (titanium isopropoxide), and $Zr(i-OC_3H_7)_4$ (zirconium isopropoxide) and the stabilizer $NH(C_2H_6OH)_2$ (diethanolamine, hereinafter referred to as DEA) with the solvent $CH_3OC_2H_4OH$ (methoxyethanol) have been used as sol-gel raw material solutions for use in $Pb(Zr, Ti)O_3$.

Since the electrical characteristics of PZT films are strongly dependent on their crystal orientation, control of this orientation is extremely important in obtaining superior electrical characteristics. However, it has been difficult in the past to obtain oriented films that exhibit superior electrical characteristics.

For example, according to Suzuki et al., Nippon Seramikkusu Kyokai Gakujutsu Ronbunshi", [Academic Papers of the Japan Ceramics Society], 98 (8), 754–78 (1990), crystal orientation is not clearly observed in the PZT films formed. Additionally, Yamamura et al. report in *Kyoyudentai Usumaku Shusekika Gijutsu*|Strong Dielectric Thin Film Integration Technology|, Chapter 3 (paragraph four), of having formed thin films with good crystal orientation from solutions obtained using acetic acid as the solvent. However, this method is suited to thin films with a thickness of several μm, and cannot be used to obtain thin films with good crystal orientation from conventional solutions in which $CH_3OC_2H_4OH$ is used as the solvent.

Thus, it has been difficult to form PZT films with good crystal orientation from solutions composed of $Pb(CH_3COO)_2 \cdot 3H_2O$, $Ti(i-OC_3H_7)_4$, $Zr(i-OC_3H_7)_4$, DEA, and $CH_3OC_2H_4OH$ by means of the sol-gel technique.

Of the series of processes shown in FIG. 18, the temperature setting performed in the drying treatment in process 3 is extremely important for the following reasons.

First, when the drying temperature is too high, numerous cracks occur in the dry gel film. Moreover, these cracks cannot be repaired by the oxidative sintering treatment performed in process 4. On the other hand, if the drying temperature is too low, the dryness of the dry gel film constituting the underlayer formed in the previous process is insufficient and said film redissolves into the newly applied sol-gel thin film, making it difficult to increase the film thickness.

Thus, in thin film forming technology based on the sol-gel technique, although temperature setting is extremely important in forming a dry gel from the sol-gel solution, no clear guidelines have been established with respect to the drying conditions in the past. Therefore, repeated experimentation has been carried out with each material to determine the optimum conditions.

An object of the present invention is to control the crystal orientation of the strong dielectric film in the aforementioned sol-gel technique to form a strong dielectric film that exhibits superior electrical characteristics.

Another object of the present invention is to obtain a strong dielectric film that has no cracks and whose thickness can easily be increased.

SUMMARY OF THE INVENTION

Specifically, the present invention pertains to a method for forming a strong dielectric film by the sol-gel technique, which includes:

(a) a process in which a raw material solution is applied;

(b) a process in which this applied raw material solution is dried to form a dry film; and (c) a process in which this dry film is sintered to produce a strong dielectric film; wherein control is effected such that the thickness of the aforementioned strong dielectric film after the aforementioned sintering is made 1000 Å or less.

In the above method, strong dielectric films with thicknesses of 1000 Å or less can be sequentially laminated by repeating the series of processes of applying, drying, and sintering the raw material solution.

As the result of painstaking investigations into the film-thickness dependence of the crystal orientation of strong dielectric films, it has been discovered, in accordance with the invention, that if the thicknesses of these films (i.e., the thicknesses of the respective films when laminated by multiple applications and dryings) are made no more than 1000 Å, subjecting them to an oxidative sintering treatment at a temperature at which perovskite crystals are formed facilitates the formation of thin films exhibiting a (100) crystal orientation.

Additionally, the present invention provides a method for forming a strong dielectric film by the sol-gel technique, which includes:

(a) a process in which a raw material solution is applied;

(b) a process in which this applied raw material solution is dried to form a dry film;

(c) a process in which the aforementioned dry film is sintered to produce a strong dielectric film;

wherein the drying temperature of the aforementioned raw material solution is made 130°–200° C.

In the above method, in the application and drying of a raw material solution containing an organometal compound, constituting the structural metal element of the strong dielectric film, and an alkanolamine, the temperature at which this drying is performed is preferably set higher than the boiling point of the solvent of the aforementioned raw material solution and lower than the boiling point of the aforementioned alkanolamine.

With regard to the above sol-gel technique, in accordance with the invention, a method has been discovered that enables optimally setting the drying treatment temperature, based on the results obtained when the sol-gel raw material was subjected to thermogravimetric analysis (TGA).

Specifically, conventional strong dielectric films were subjected to TGA and it was discovered, in accordance with the invention, from the results that the factor behind cracking in dry gel films is the thermal contraction that occurs in accompaniment with the precipitous evaporation of the stabilizer contained in the sol-gel raw material. FIG. 19 shows the results of TGA obtained for the aforementioned sol-gel raw material. The peak observed in the vicinity of 200° C. is the weight change accompanying the precipitous evaporation (boiling off) of the DEA.

Additionally, in accordance with the invention, it was ascertained that the factor preventing thick film formation is the solvent left behind in the dry gel film; it was demonstrated that when the drying temperature is set at too low a value in order to prevent cracking, the drying is incomplete, and the dry gel formed in the previous process is redissolved in the freshly applied sol-gel thin film.

On the basis of the above results, it was discovered in accordance with the invention that a thick film could be formed without cracks when the drying temperature was set within a specified range of 130°–200° C., particularly when the drying temperature was set lower than the boiling point of the stabilizer contained in the sol-gel raw material and higher than the boiling point of the solvent contained in the sol-gel raw material.

Specifically, in the method of the present invention, a dry film obtained by applying and drying a raw material solution containing a lead fatty acid salt such as lead acetate expressed by $Pb(CH_3COO)_2 \cdot 3H_2O$, a titanium alkoxide expressed by $Ti(i-OC_3H_7)_4$, a zirconium alkoxide expressed by $Zr(i-OC_3H_7)_4$, an alkanolamine such as diethanolamine (DEA), and/or a $\beta$ diketone such as acetylacetone is oxidatively sintered to form a titanium zirconate titanate strong dielectric film. Additionally, the present invention provides a method for manufacturing a capacitor (and particularly a capacitor for a semiconductor memory device such as dynamic RAM) in which a strong dielectric film obtained by a sol-gel technique is formed upon a lower electrode. The unnecessary areas of this strong dielectric film are removed to leave a strong dielectric film having a specified pattern upon the aforementioned lower electrode, and an upper electrode is then formed upon this strong dielectric film.

Figure 1:
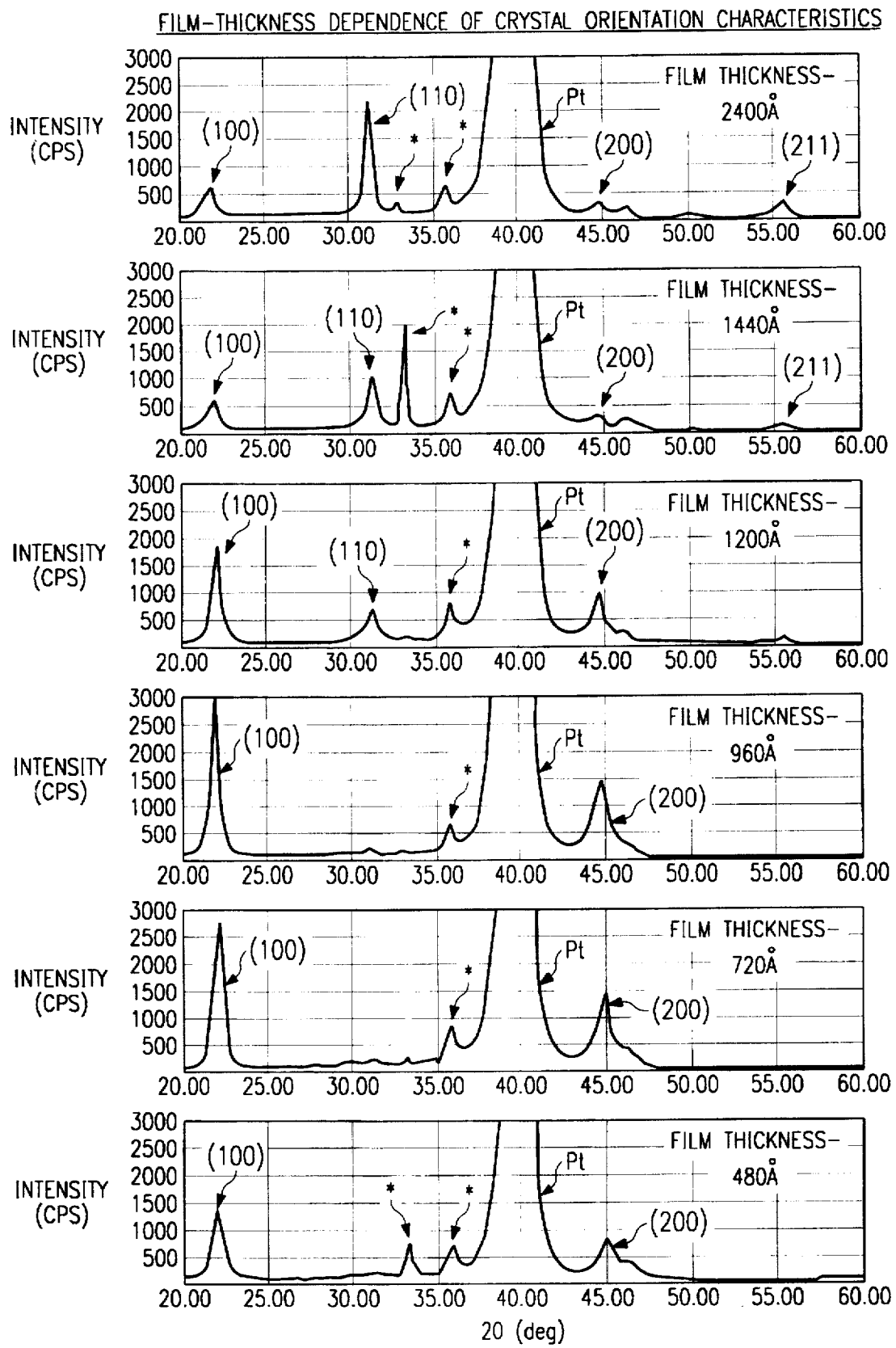
FIG. 1 is a diagram of X-ray diffraction spectra for each of the film thicknesses produced when a thin film was formed by the sol-gel technique.

Reference numerals and symbols as shown in the drawings:

1 substrate (Pt electrode)

3 $N^+$-type source region

4 $N^+$-type drain region 6 lower electrode 7, 7a, 7b strong dielectric films (PZT thin films)

8 upper electrode 17a, 17b, 17c application solutions

CAP capacitor

TR transfer gate

M-CEL memory cell

DESCRIPTION OF PREFERRED EMBODIMENTS

First, the raw material solution using the sol-gel technique pertaining to an embodiment of the invention was obtained by diluting $Pb(CH_3COO)_2 \cdot 3H_2O$, $Ti(i-OC_3H_7)_4$, $Zr(i-OC_3H_7)_4$, and DEA (diethanolamine) with $CH_3OC_2H_4OH$ as shown in Table I below.

TABLE I

| Composition of the solution | Units: mol/L |
|---|---|
| Structural Compound | Solution Composition |
| $(CH_3COO)_2 Pb \cdot 3H_2O$ | 0.10 |
| $Zr(i-OC_2H_7)_4$ | 0.05 |
| $Ti(i-OC_2H_7)_4$ | 0.05 |
| $NH(C_2H_4OH)_2$ | 0.20 |

Figure 3:
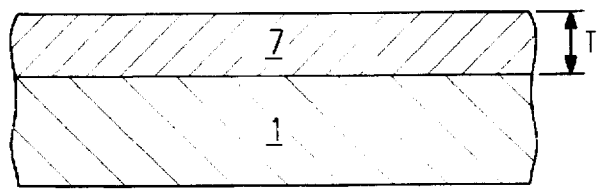
FIG. 3 is schematic cross-sectional view of a PZT thin film formed upon a substrate.
Figure 18:
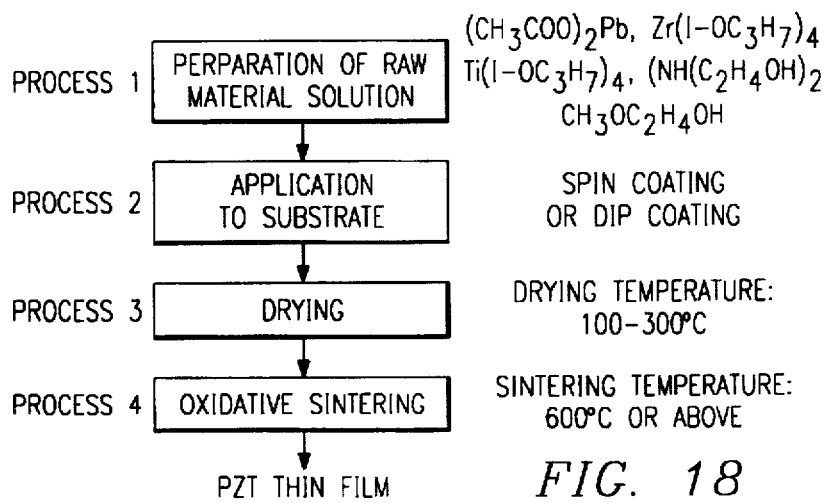
FIG. 18 is a flow chart of a process for forming a $Pb(Zr, Ti)O_3$ thin film by the sol-gel technique.
Figure 19:
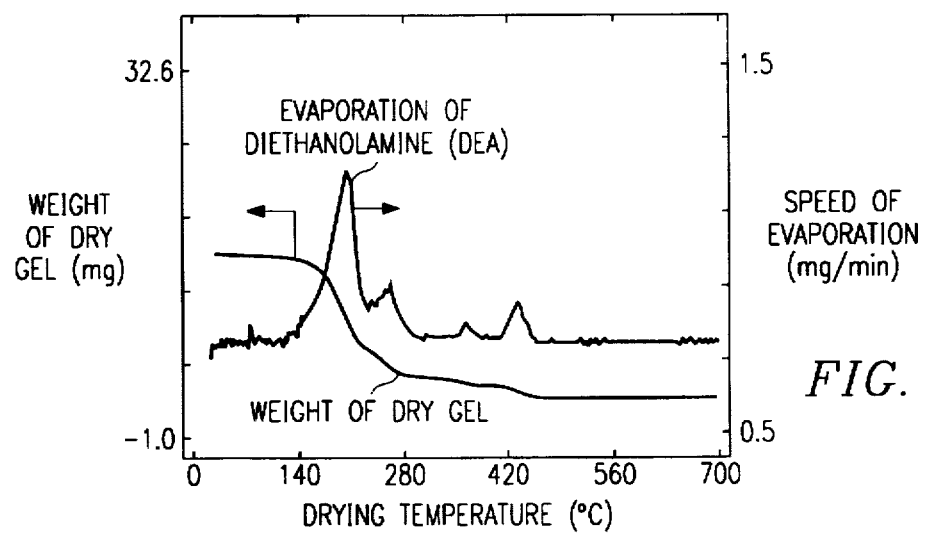
FIG. 19 is a graph showing the weight changes (by TGA) due to the drying temperature in forming a $Pb(Zr, Ti)O_3$ thin film by the sol-gel technique.

As shown by the schematic in FIG. 3, the above raw material solution was then applied and dried upon a Pt electrode 1 in accordance with processes 2 and 3 shown in FIG. 18. In so doing, 6 types of dry gel films 7 were obtained so that the thicknesses of the thick films T obtained by the oxidative sintering after drying were 480 Å, 720 Å, 960 Å, 1200 Å, 1440 Å, and 2400 Å.

Because the application thickness of the aforementioned raw material solution was limited to 480 Å in a single application, film thicknesses of 480 Å (one to two applications), 720 Å (two to three applications), 960 Å (two to four applications), 1200 Å (three to five applications), 1440 Å (three to six applications), and 2400 Å (five to ten applications), respectively, were obtained by making overlapping applications of films with thicknesses of 480 Å or less.

Oxidative sintering treatment was then performed for 1 h at 600° C., after which the crystal orientation of each of the aforementioned samples was investigated by means of X-ray diffractometry. FIG. 1 shows the X-ray diffraction patterns for the respective film thicknesses.

Upon studying the above X-ray diffraction patterns, perovskite crystal (100) and (200) diffraction peaks are observed at film thicknesses of 480 Å, 720 Å, and 960 Å, and thin films with these thicknesses are found to have a (100) orientation.

On the other hand, (100), (110), (200), and (211) diffraction peaks are observed at film thicknesses of 1200 Å, 1440 Å, and 2400 Å, and thin films with these thicknesses are found to be nonoriented. Thus, thin films with these thicknesses had poor crystal orientation as the thickness exceeded 1000 Å.

As is clear from the above, the orientation properties of the thin film are highly dependent on the film thickness, that is, a (100) crystal orientation can be obtained by setting the film thickness within a specified range. Specifically, a thin film with a (100) crystal orientation is formed through creating a thin film by setting the film thickness at 1000 Å or less, but when the film thickness exceeds 1000 Å, only a nonoriented thin film will be obtained. The film thickness can be set at not less than 500 Å or not more than 1000 Å. Additionally, the lower limit of the film thickness is set at 240 Å in consideration of practical measurability.

In relation to the formation of PZT strong dielectric films by the sol-gel technique as described above, the fact that film thicknesses obtained by oxidative sintering have major effects on the crystal orientation characteristics of thin films was first elucidated by the present invention.

Figure 4A:
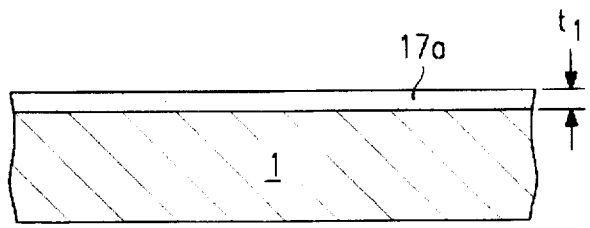
FIG. 4 is a schematic cross-sectional view of a PZT thin film formed by the lamination of multiple layers upon the substrate.
Figure 4B:
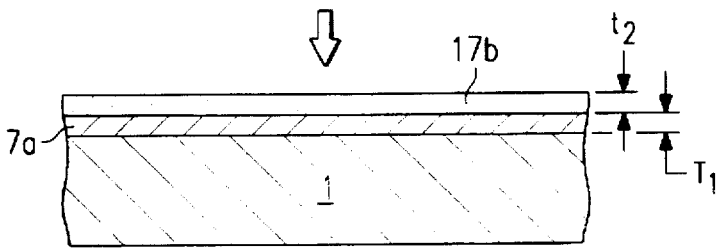
Figure 4C:
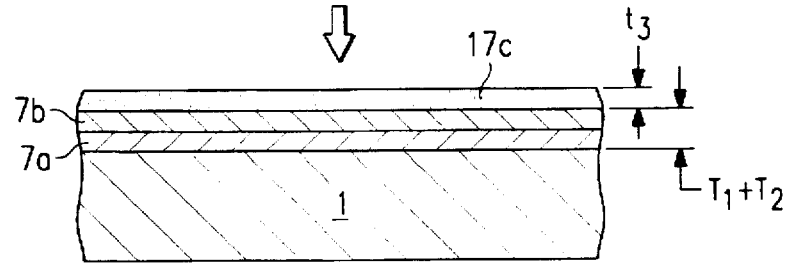

Next, as shown by FIG. 4, instead of applying a PZT strong dielectric film only once, PZT strong dielectric films were sequentially laminated in the order of first layer $7a$, second layer $7b$ ... in accordance with processes 2, 3, and 4 shown in FIG. 18, whereby a thick oriented film was formed. For example, by laminating five layers $7a$, $7b$ ... with thicknesses of 480 Å each, a (100) oriented film 7 with a thickness of 2400 Å was formed.

In the above lamination, as shown in FIG. 4, the raw material solution $17a$ of the first layer $7a$ was applied to a thickness $t_1$ and made into a dry gel at 100°–300°, which was then oxidatively sintered for 1 h at 600° C. to form a first layer oxidatively sintered film $7a$ with a thickness $T_1$. In the same manner, a raw material solution $17b$ of the second layer $7b$ was applied to this $7a$ to a thickness $t_2$, dried, and oxidatively sintered so as to be formed into second layer oxidatively sintered $7b$ with a thickness $T_2$. A PZT thin film 7 with a thickness T composed of five sintered films $7a$, $7b$, $7c$ .... was formed by continuing the operation so as to apply a raw material solution $17c$ to a thickness of $t_3$, then drying it and subjecting it to oxidative sintering ...

Here, each of the laminated sintered film thicknesses $T_1$, $T_2$ ... were made 480 Å; the total thickness T was made 2400 Å. The X-ray diffraction pattern of the obtained PZT thin film 7 is shown in FIG. 2.

Figure 2:
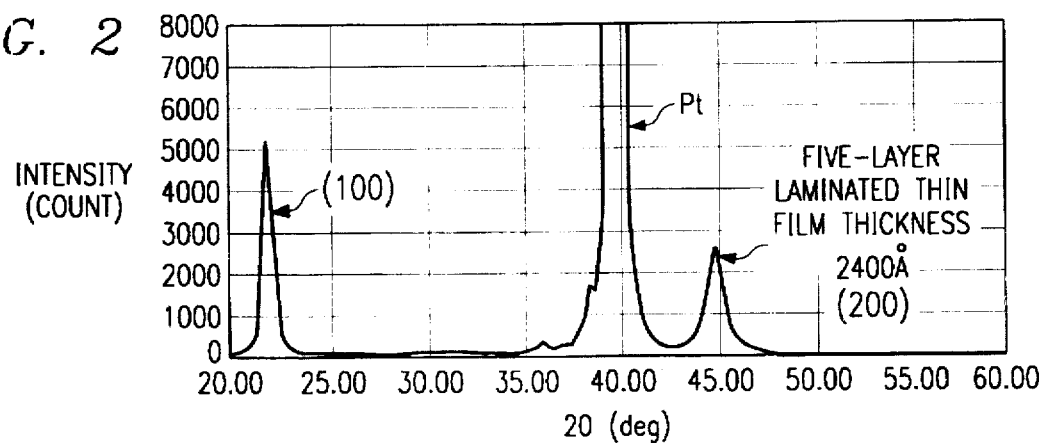
FIG. 2 is a diagram of X-ray diffraction spectra for a thin film obtained by laminating 5 films in accordance with the present invention.

In FIG. 2, the PZT thin film 7 exhibits a perovskite crystal diffraction peak at (100) and (200), and is found to be a (100) crystal oriented film. This is due to the fact that even though the total thickness T of the PZT thin film is 2400 Å, the thicknesses of the respective films $7a$, $7b$ ... that make up the PZT thin film are each 480 Å and thus within the range (1000 Å or less) of the present invention, so that a (100) crystal orientation is obtained in each of the films.

FIG. 5 shows the measured current (leak current)-applied voltage characteristics of the aforementioned PZT (100) crystal oriented film 7 with a total thickness T of 2400 Å obtained in accordance with the present invention, as well as those of the aforementioned nonoriented film with a thickness of 2400 Å (see FIG. 1).

Figure 5A:
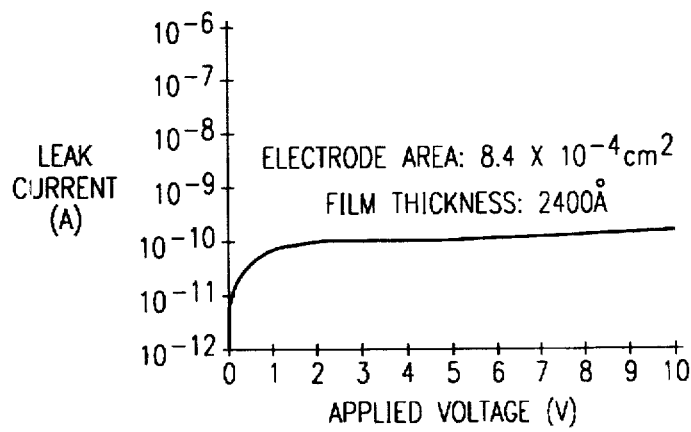
FIGS. 5A and 5B are diagrams of the current-voltage characteristics for a PZT oriented film and a nonoriented film, respectively.
Figure 5B:
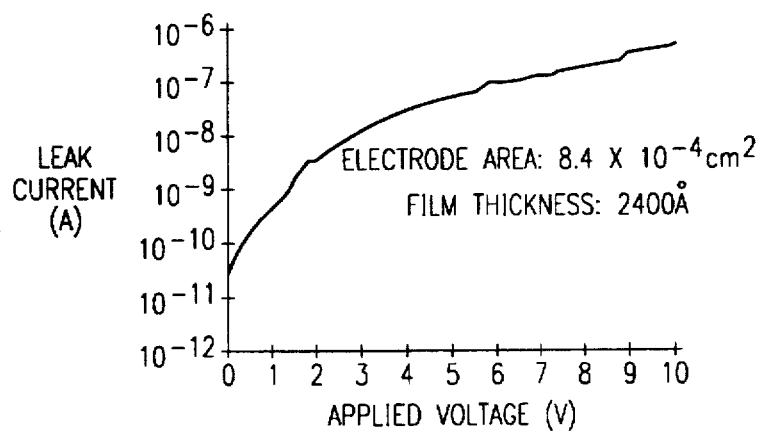

According to the above results, as shown in FIG. 5A, with the thin film based on the present invention, the leak current increases in the voltage range of 0–2 V, but exhibits a virtually constant value in the voltage range of 2–10 V, with the value at a voltage of 3 V (electrical field strength of 125 kV/cm) being $1.2 \times 10^{-7}$ A/cm$^2$. However, with the nonoriented film, as shown in FIG. 5B, the value at a voltage of 3 V is $2.2 \times 10^{-6}$ A/cm$^2$. Accordingly, it is found that the leak current of the oriented film based on the present invention is markedly reduced from that with the nonoriented film.

Figure 6:
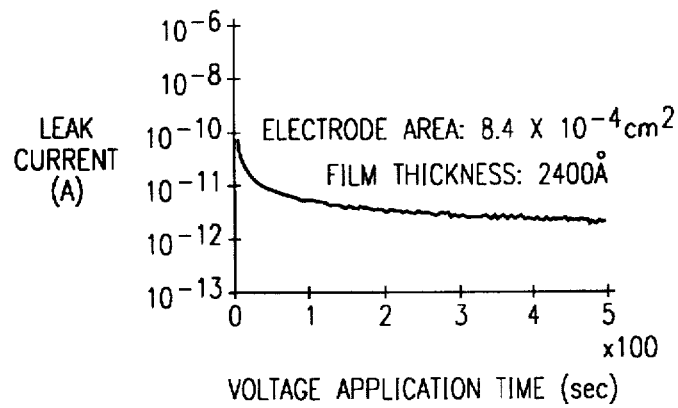
FIG. 6 is a diagram of current-time characteristics of the PZT oriented film (under the application of 3 V)

FIG. 6 shows the measured current (leak current)-voltage application time characteristics for the aforementioned PZT (100) crystal oriented film 7 with a total thickness T of 2400 Å obtained in accordance with the present invention.

According to these results, the leak current is monotonically reduced and is dependent on the application time. The value after approximately 5 min under the application of a voltage of 3 V is 3 nA/cm$^2$. By creating an oriented film in this manner, the leak current can be reduced without the addition of La or Fe.

Next, an investigation was conducted on the condition of thin films obtained by setting various drying temperatures on the basis of the pyrolytic characteristics of the raw material solution in forming thin films by the sol-gel technique.

The sol-gel solutions used in this investigation were the same as the aforementioned ones shown in Table I. Dry gel films with thicknesses of 2400 Å were formed in the aforementioned manner upon a Pt electrode 1 in accordance with the processes shown in FIG. 18; the surfaces of these films were examined.

Figure 7A:
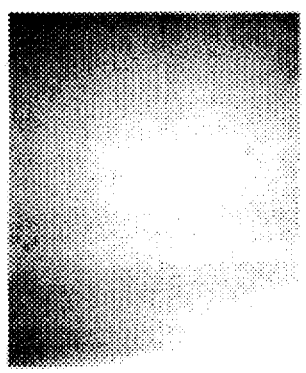
FIGS. 7A and 7B are micrographs of a crack-free film and a cracked film, respectively.
Figure 7B:
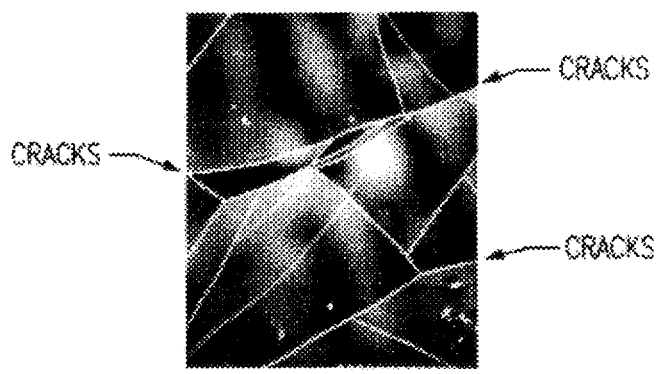

FIG. 7A shows the results obtained when the drying temperature was set at 170° C., a value lower than the boiling point of DEA (269° C.) and higher than the boiling point of the solvent (94° C.), with no cracking being observed. However, when the drying temperature was set at 280° C. and thus higher than the aforementioned boiling point of the DEA, as shown in FIG. 7B, numerous instances of cracking were found to occur.

The above results show that carrying out a drying treatment at a temperature lower than the boiling point of the stabilizer (DEA) prevents the DEA from boiling off and provides a crack-free dry gel film.

Figure 8:
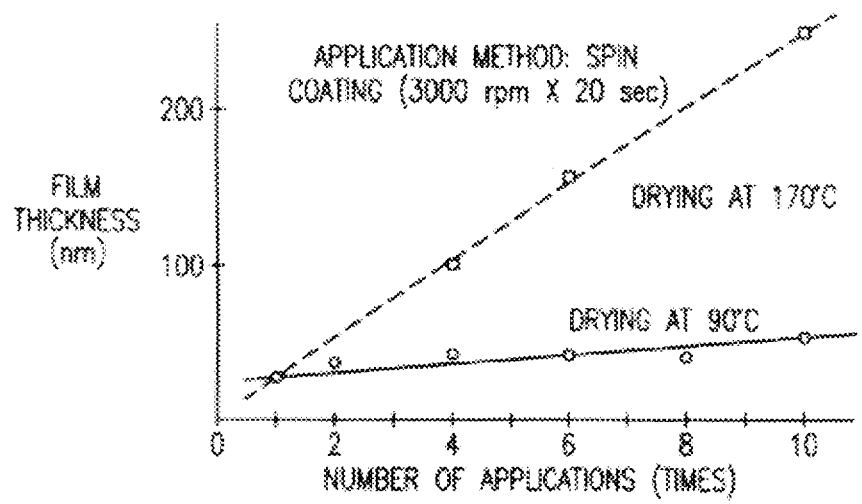
FIG. 8 is a graph showing the film-thickness changes per number of applications at various drying temperatures.

Next, the results of forming thick films under the aforementioned multiple applications will be discussed. FIG. 8 shows the relation between the number of repeated applications and the thickness of the dry gel film occurring when processes 2 and 3 shown in Table 18 were repeatedly performed, with the drying temperature in process 3 being used as a parameter. The applications were made under conditions of 3000 rpm×20 sec by spin coating.

According to the results, when the drying temperature is lower than the boiling point (94° C.) of the $CH_3OC_2H_4OH$ solvent, no increase in film thickness is observed under repeated applications, whereas if the drying temperature is set at 170° C. and thus higher than the boiling point of the solvent, an increase in film thickness proportional to the number of repeated applications will be obtained.

Specifically, when the drying temperature is lower than the boiling point of the solvent, the dry state is incomplete, and the dry gel film formed in the previous process redissolves in the freshly applied sol-gel thin film so that a thick film cannot be created. However, if the drying temperature is set higher than the boiling point of the solvent in accordance with the present invention, the undercoat gel film will undergo sufficient drying and the overcoat gel film will laminate well, making it possible to form the film thickly as a whole.

If the drying temperature is set within a range of 130°-200° C. (170° C. in the present example), and particularly if it is set lower than the boiling point of the stabilizer contained in the sol-gel raw material and higher than the boiling point of the solvent contained in the sol-gel raw material, it will be possible to form a completely crack-free film. If the drying temperature is made 150°-190° C., this effect will be made even more marked.

The optimum value for the drying temperature in the sol-gel technique differs depending on items such as the type of stabilizers and solvents used; numerous experiments are thus necessary. However, when the present invention is implemented, the optimum drying conditions can be easily determined in a short period of time on the basis of thermogravimetry.

Figure 9:
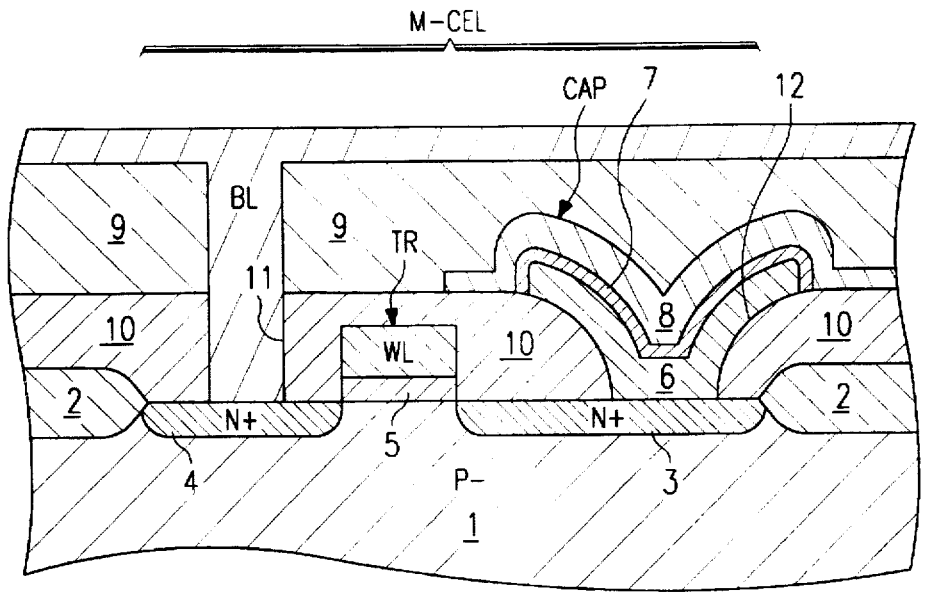
FIG. 9 is a magnified cross-sectional view (taken along line IX—IX of FIG. 10) of a dynamic RAM memory cell.
Figure 10:
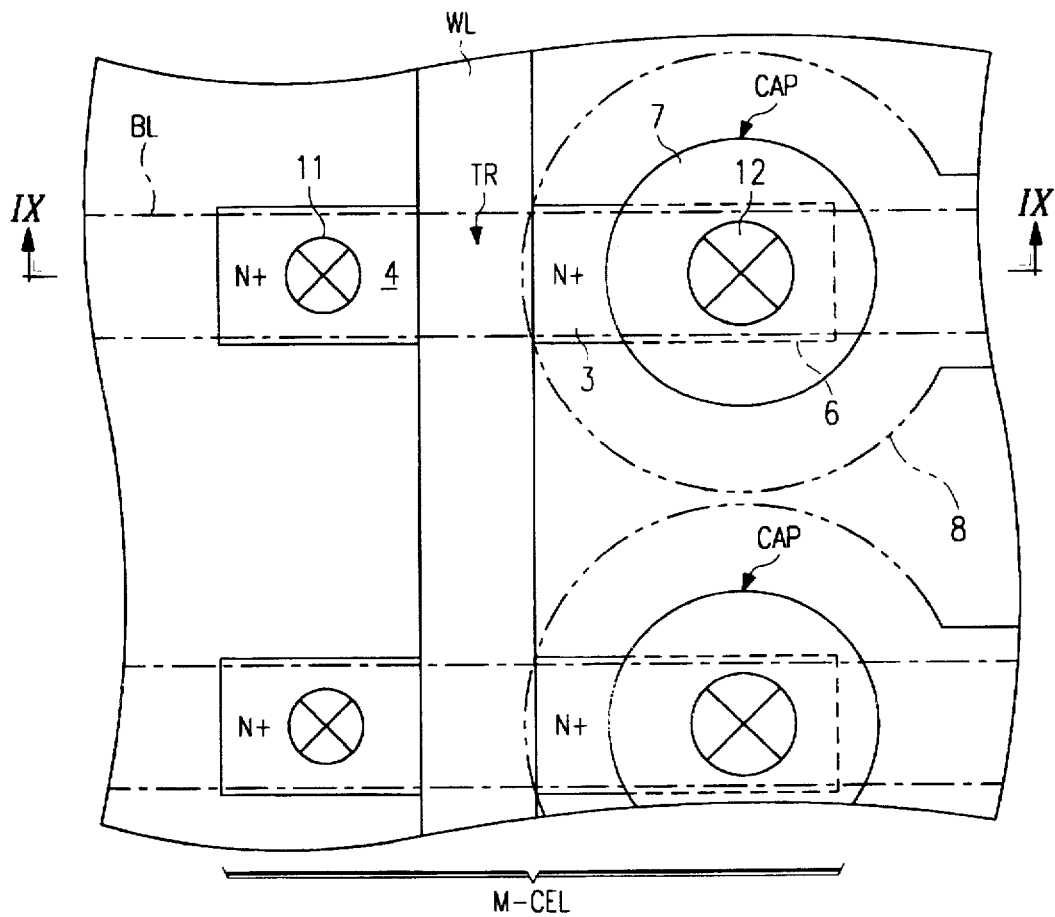
FIG. 10 is a magnified planar view of the memory cell shown in FIG. 9.

As described above, because the PZT crystal thin film of the present invention has enhanced electrical characteristics (such as a reduction in leak current) due to the (100) orientation and can be formed at the desired thickness without cracks, etc., it is extremely useful when used in applications such as capacitors (e.g., stack capacitors) for dynamic RAM memory cells. FIGS. 9 and 10 show examples of a dynamic RAM memory cell.

Element regions demarcated by a field oxide film 2 are formed on the main surface of a P⁻-type silicon substrate 1, wherein a memory cell M-CEL composed of a capacitor CAP and a transfer gate TR consisting of a MOS transistor is provided.

In the transfer gate TR, an N⁺-type source region 3 and an N⁺-type drain region 4 are each formed by impurity diffusion, a word line WL is provided via a gate oxide film 5 between these two regions, and a bit line BL is connected to the drain region 4 through a contact hole 11 in layers 9 and 10 of an insulating material such as $SiO_2$.

In the capacitor CAP, referred to as a stack capacitor, a lower electrode 6 is connected to the source region 3 through a contact hole 12 in the insulating layer 10; the PZT strong dielectric film 7 and an upper electrode 8 are sequentially laminated upon this lower electrode.

The PZT strong dielectric film 7 that forms the capacitor CAP consists of a PZT film, i.e., a $Pb(Zr, Ti)O_3$ film formed by the sol-gel technique in accordance with the present invention using the aforementioned raw material solutions. Additionally, the lower electrode 6 is obtained by depositing Pt or some other material on a layer of tungsten or titanium nitride (Pt or other material not shown in the figures). The upper electrode (8) contacting the strong dielectric film is composed of a material such as aluminum or Pt.

The method for preparing the above memory cell M-CEL will now be explained in FIGS. 11-17.

Figure 11:
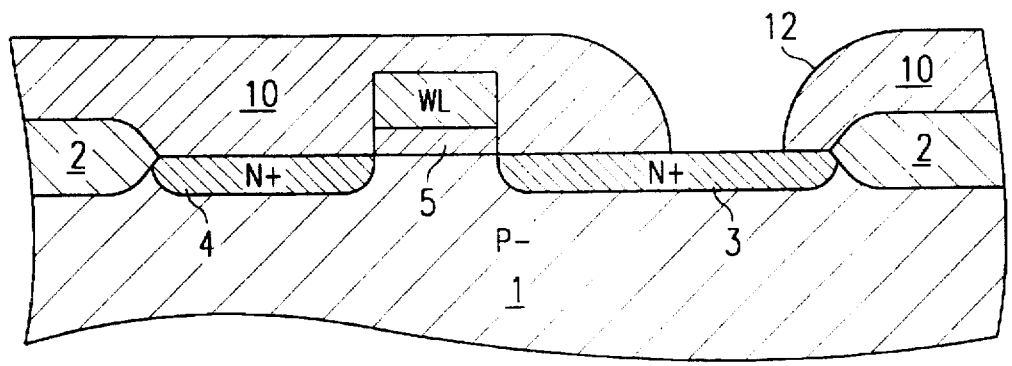
FIG. 11 is a magnified cross-sectional view of a processing stage in the method for manufacturing the memory cell of FIGS. 9 and 10.

First, as shown in FIG. 11, the field oxide film 2 is formed by selective oxidation upon the P⁻-type silicon substrate (wafer) 1. The gate oxide film 5 and the polysilicon word line WL are formed by thermal oxidation and chemical vapor-phase epitaxy, respectively; the N-type source region 3 and the N⁺-type drain region 4 are then respectively formed by the thermal diffusion of N-type impurities such as As.

The contact hole 12 is then formed by photolithography on the source region 3 with respect to the $SiO_2$ insulating layer 10 deposited by chemical vapor-phase epitaxy over the entire surface.

Figure 12:
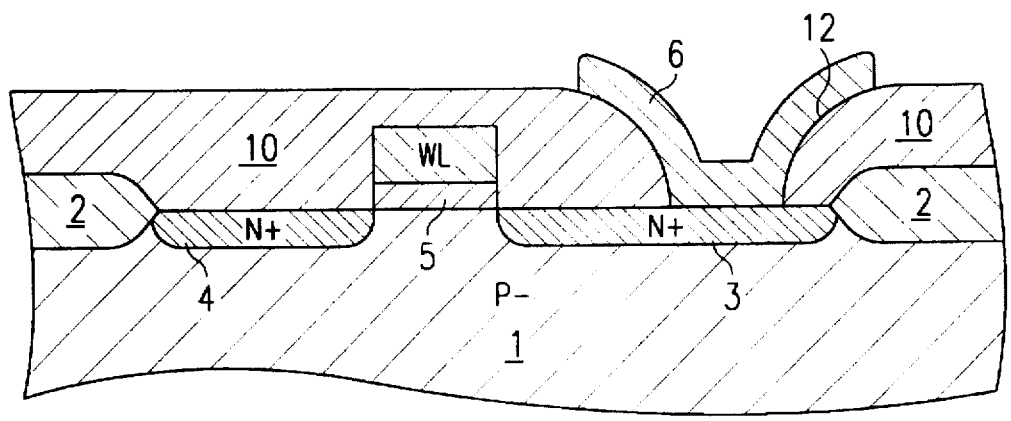
FIG. 12 is a magnified cross-sectional view of another processing stage in the method for manufacturing the memory cell of FIGS. 9 and 10.

As shown in FIG. 12, the lower electrode 6 possessing a Pt layer upon a tungsten or titanium nitride layer is then formed so as to contact the source region 3 in the contact hole 12. This lower electrode 6 can be formed using photolithography to pattern the Pt surface layer and the tungsten or titanium nitride layer deposited over the entire surface.

Figure 13:
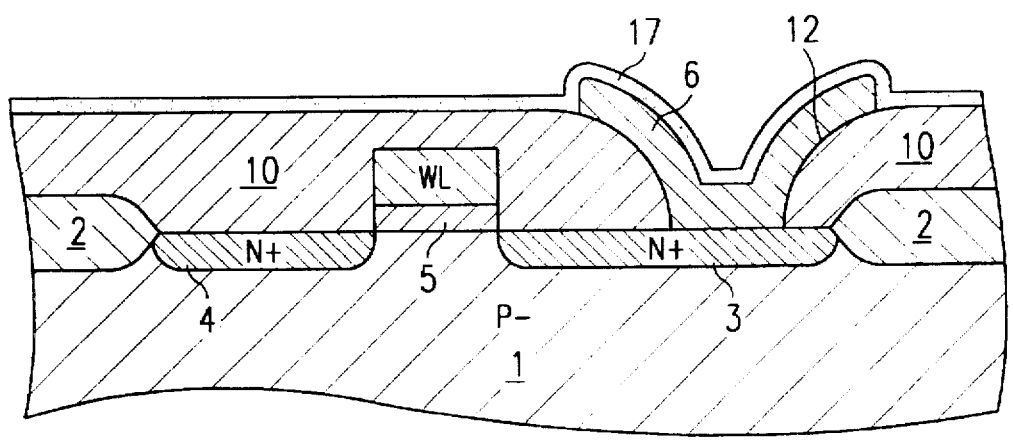
FIG. 13 is a magnified cross-sectional view of another processing stage in the method for manufacturing the memory cell of FIGS. 9 and 10.

As shown in FIG. 13, the sol-gel raw material solution 17 is then applied to the entire surface, including the lower electrode 6, by spin coating or dip coating. This raw material solution 17 has the same composition as the solution described above (see Table I).

Figure 14:
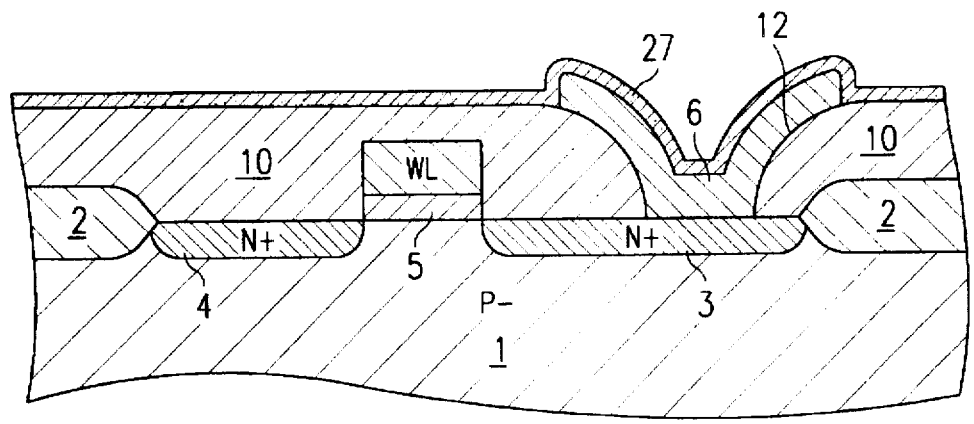
FIG. 14 is a magnified cross-sectional view of another processing stage in the method for manufacturing the memory cell of FIGS. 9 and 10.

The wafer to which the raw material solution 17 has been applied is then heated at a specified temperature (100°-300° C., particularly 130°-200° C.) to dry the applied solution, thus forming a dry gel film 27 as shown in FIG. 14.

Figure 15:
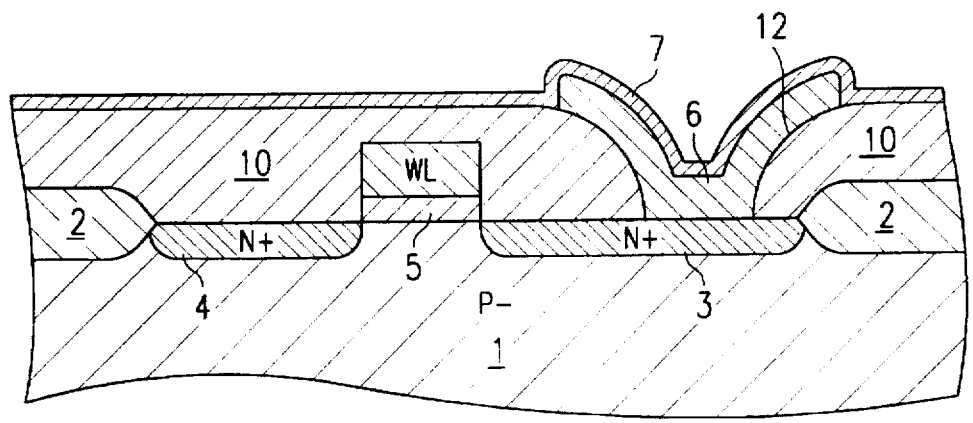
FIG. 15 is a magnified cross-sectional view of another processing stage in the method for manufacturing the memory cell of FIGS. 9 and 10.

When completely dry, the wafer is then oxidatively sintered at a temperature at which perovskite crystals form, thus forming the strong dielectric film 7 over the entire surface as shown in FIG. 15.

To form the strong dielectric film 7 at the desired thickness (e.g., 2400 Å), the application process shown in FIG. 13 and the drying process shown in FIG. 14 are repeated as needed so that, instead of obtaining the targeted film thickness in one step, the final sintered film thickness can be obtained through repeatedly forming sintered films with thicknesses of 1000 Å or less by lamination upon dry films.

The drying of the respective films is preferably carried out at 130°-200° C. in accordance with the present invention. At the same time, after the respective films have been oxidatively sintered and thus made into sintered films, it is preferable to also apply overcoats thereto and subject them to drying and oxidative sintering to provide thin films 7 with total thicknesses of 1000 Å or less. In this process, the aforementioned drying conditions (130°-200° C.) need not necessarily be adopted (the same holds true for the opposite situation).

Figure 16:
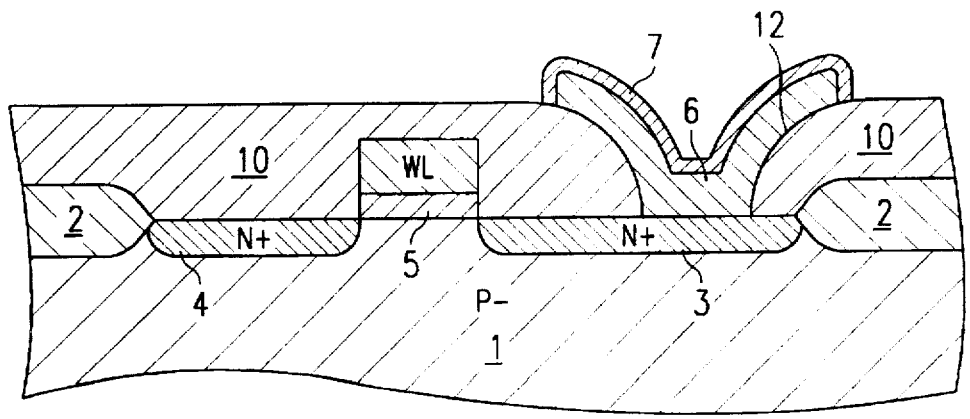
FIG. 16 is a magnified cross-sectional view of another processing stage in the method for manufacturing the memory cell of FIGS. 9 and 10.

As shown in FIG. 16, the unnecessary areas of the strong dielectric film 7 formed upon the entire surface are then removed by means of dry etching or the like; the PZT strong dielectric film 7 is thus formed in a specified pattern upon the lower electrode 6.

Figure 17:
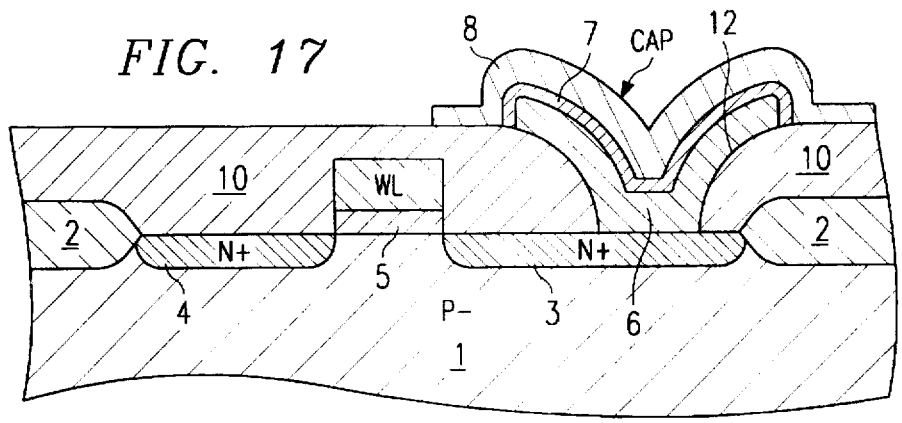
FIG. 17 is a magnified cross-sectional view of yet another processing stage in the method for manufacturing the memory cell of FIGS. 9 and 10.

As shown in FIG. 17, the upper electrode 8 composed of a material such as aluminum or Pt is then formed in a specified pattern in the areas of contact with the strong dielectric film 7 by means of photolithography.

Notwithstanding that the memory cell is prepared in the manner explained above, if the thickness of the PZT strong dielectric film 7 (when a film is laminated by multiple applications and dryings, the thickness of each of the respective films) is made 1000 Å or less, performing the oxidative sintering treatment at a temperature at which perovskite crystals form will render it possible to easily form thin films exhibiting a (100) crystal orientation in particular, and therefore they will exhibit the required electrical characteristics, such as increased leak resistance.

Additionally, because the drying temperature of the PZT film 7 is set within the range of 130°–200° C., and particularly because the drying temperature is set lower than the boiling point of the stabilizer contained in the sol-gel raw material and higher than the boiling point of the solvent contained in the sol-gel raw material, a completely crack-free thick film can be formed.

The embodiment of the present invention explained above can also be modified on the basis of the technological concepts of the present invention.

Besides DEA, alkanolamines such as dipropanolamine and triethanolamine or β-diketones such as acetylacetone can each be used alone or concurrently as constituents of the aforementioned sol-gel raw material solution.

Besides the aforementioned lead acetate, it is also possible to use lead fatty acid salts such as lead-2-ethylhexanoate and lead naphthenate as well as lead alkoxides such as lead-di-n-butoxide and lead-di-n-pentoxide.

Besides titanium isopropoxide, it is also possible to use titanium alkoxides such as titanium-tetra-n-butoxide and titaniumtetra-n-pentoxide as well as titanium salts of fatty acids such as titanium 2-ethylhexanoate and titanium naphthenate.

Besides zirconium isopropoxide, it is also possible to use zirconium alkoxides such as zirconium-tetra-n-butoxide and zirconium-tetra-n-pentoxide as well as zirconium salts of fatty acids such as zirconium 2-ethylhexanoate and zirconium naphthenate.

Besides the methoxyethanol used as the solvent of the raw material solution, it is also possible to use solvents such as isopropanol and n-butanol.

The composition of the strong dielectric pertaining to the present invention can be modified in various ways. Additionally, the intended application of the present invention is not limited to the aforementioned stack capacitors, i.e., it is possible to use a structure in which the aforementioned stack capacitor is provided upon the $SiO_2$ film and the lower electrode of this capacitor is extended so that it connects to the source region of the transfer gate; capacitors that are not stack capacitors but are structured so as to be incorporated into the so-called trench can be also be used.

As described above, in the present invention, when a strong dielectric film is formed by the sol-gel technique, because the thickness of the film is kept to a value of 1000 Å or less, performing an oxidative sintering treatment at a temperature at which perovskite crystals form will render it possible to easily form thin films exhibiting a (100) crystal orientation in particular.

Additionally, because the drying temperature of the raw material solution is set within the range of 130°–200° C., and particularly because the drying temperature is set lower than the boiling point of the stabilizer contained in the sol-gel raw material and higher than the boiling point of the solvent contained in the sol-gel raw material, a completely crack-free thick film can be formed.

We claim:

1. A method of forming a film of ferrolectric material with a perovskite crystalline structure by the sol-gel technique, said method comprising:

preparing a raw material solution containing an organo metallic compound of a metallic element from which the film of ferroelectric material is to be formed, a stabilizer taken from one or a combination of substances of the group consisting of an alkanolamine and a β-diketone, and a solvent;

providing a coating of the raw material solution on a substrate;

drying the coating of the raw material solution at a temperature higher than the boiling point of the solvent included in said raw material solution and lower than the boiling point of the stabilizer included in said raw material solution to form a dried gel film, the drying of the coating of the raw material solution in forming the dried gel film being carried out at a temperature in the range of 130°–200° C.; and oxidatively sintering the dried gel film under controlled conditions at a temperature sufficient for forming perovskite crystals to provide a strong dielectric film of ferroelectric material with a perovskite crystalline structure and having a thickness no greater than 1000 Å.

2. A method as set forth in claim 1, wherein the raw material solution contains a lead fatty acid, titanium alkoxide, and zirconium alkoxide as organo metallic compounds of respective metallic elements from which the film of ferroelectric material is to be formed.

3. A method as set forth in claim 2, wherein the oxidative sintering of the dried gel film produces a dielectric film of ferroelectric material with a perovskite crystalline structure exhibiting a (100) crystal orientation.

4. A method as set forth in claim 3, wherein the solvent included in the raw material solution is $CH_3OC_2H_4OH$; and the drying of the coating of raw material solution in forming the dried gel film is carried out at a temperature of the order, of 170° C.

5. A method as set forth in claim 1, wherein the thickness of the dielectric film of ferroelectric material with a perovskite crystalline structure as provided by the oxidative sintering of the dried gel film is maintained in a range of 240 Å–1000 Å.

6. A method as set forth in claim 5, wherein the dielectric film of ferroelectric material with a perovskite crystalline structure as provided by oxidative sintering of the dried gel film has a thickness in the range of 500 Å–1000 Å.

7. A method for producing a capacitor having a film of ferroelectric material as a dielectric between upper and lower electrodes of electrically conductive material, said method comprising:

preparing a raw material solution containing an organo metallic compound of a metallic element from which the film of ferroelectric material is to be formed, a stabilizer taken from one or a combination of substances of the group consisting of an alkanolamine and a β-diketone, and a solvent;

providing a coating of the raw material solution on an electrically conductive substrate which is to serve as the lower electrode of the capacitor;

drying the coating of the raw material solution as applied to the electrically conductive substrate at a temperature higher than the boiling point of the solvent included in the raw material solution and lower than the boiling point of the stabilizer included in the raw material solution to form a dried gel film, the drying of the coating of the raw material solution in forming the dried gel film being carried out at a temperature in the range of 130°–200° C.;

oxidatively sintering the dried gel film under controlled conditions at a temperature sufficient for forming perovskite crystals to provide a strong dielectric film of ferroelectric material with a perovskite crystalline structure and having a thickness no greater than 1000 Å;

forming a film of ferroelectric material having a perovskite crystalline structure on the electrically conductive substrate which is to serve as the lower electrode of the capacitor in response to the oxidative sintering of the dried gel film;

patterning the film of ferroelectric material having the perovskite crystalline structure to remove unnecessary portions of the film of ferroelectric material having the perovskite crystalline structure from the electrically conductive substrate which is to serve as the lower electrode of the capacitor; and forming an upper electrode of electrically conductive material over the patterned film of ferroelectric material having the perovskite crystalline structure.

8. The method described in claim 7, in which a capacitor for a semiconductor memory device is formed.

9. A method of forming a film of ferroelectric material with a perovskite crystalline structure by the sol-gel technique, said method comprising:

preparing a raw material solution containing an organo metallic compound of a metallic element from which the film of ferroelectric material is to be formed and a solvent;

providing a coating of the raw material solution on a substrate;

drying the coating of the raw material solution at a temperature in the range of 130°–200° C. to drive off at least a portion of the solvent forming a dried gel film; and oxidatively sintering the dried gel film under controlled conditions at a temperature sufficient for forming perovskite crystals to provide a strong dielectric film of ferroelectric material with a perovskite crystalline structure and having a thickness no greater than 1000 Å.

* * * * *